United States Patent [19]

Elliott

[11] 4,342,007

[45] Jul. 27, 1982

[54] SWEPT FREQUENCY OSCILLATOR WITH COMPENSATION FOR VARIATIONS IN TUNING SENSITIVITY

[75] Inventor: Robert Elliott, St. Albans, England

[73] Assignee: Marconi Instruments Limited, Chelmsford, England

[21] Appl. No.: 146,731

[22] Filed: May 2, 1980

[30] Foreign Application Priority Data

May 4, 1979 [GB] United Kingdom ............... 7915711

[51] Int. Cl.³ .................... H03B 23/00; H03L 7/08
[52] U.S. Cl. ...................................... 334/4; 331/178; 328/184; 455/164; 455/165; 455/168; 455/169
[58] Field of Search ................... 331/4, 178; 328/184; 455/161, 164, 165, 168, 169

[56] References Cited

U.S. PATENT DOCUMENTS

| | | | |
|---|---|---|---|
| 3,364,437 | 1/1968 | Loposer et al. | 331/4 X |
| 3,391,348 | 7/1968 | Köhler | 331/4 |
| 4,038,612 | 7/1977 | Borofka et al. | 331/178 |

*Primary Examiner*—Siegfried H. Grimm
*Attorney, Agent, or Firm*—Spencer & Kaye

[57] ABSTRACT

In a swept frequency oscillator arrangement compensation is provided for the non-linearities in the tuning sensitivity of the oscillator. The non-linearities are initially measured and stored. Subsequently the stored values are used to control the rate at which the clock pulses are integrated to produce a control signal for the oscillator.

13 Claims, 2 Drawing Figures

SWEPT FREQUENCY OSCILLATOR WITH COMPENSATION FOR VARIATIONS IN TUNING SENSITIVITY

BACKGROUND OF THE INVENTION

This invention relates to swept frequency oscillator arrangements in which the output frequency can be varied in a controlled manner so as to sweep over a predetermined frequency range. A number of applications require the use of a swept frequency oscillator arrangement, and one such requirement exists in a spectrum analyser which is used to indicate the presence of particular frequencies in a received wide band electrical signal. The output frequency of a variable frequency oscillator is not always linearly related to the level of the control signal fed to it and which is used to change its frequency; that is to say, the tuning sensitivity of the oscillator is not constant, but is a function of the frequency at which it is oscillating. Because of this it has been customary to provide a degree of pre-distortion for the control signal to compensate for known non-linearities in the oscillator characteristics and this has been achieved by using a transistor or diode shaper network whose gain is a function of its input signal level. Networks of this kind use a large number of circuit components, can be extremely difficult to set up accurately, and have limited versatility. The present invention seeks to provide an improved swept frequency oscillator arrangement.

SUMMARY OF THE INVENTION

According to this invention a swept frequency oscillator arrangement includes a variable frequency oscillator which provides a variable frequency output signal in dependence on the magnitude of a control signal; means for generating a succession of pulses derived from a fixed frequency source to produce said control signal; and means for varying the rate at which said pulses are generated, so as to compensate for variations in the tuning sensitivity of the oscillator.

In general the control signal will have amplitude steps corresponding to the individual pulses from which it is produced and preferably the control signal is smoothed by passing it through a low pass filter before it is applied to the variable frequency oscillator.

Preferably said means for varying the rate at which pulses are generated includes a store which contains a plurality of said values representative of the tuning sensitivity of the variable frequency oscillator for contiguous portions of the frequency range over which the swept frequency oscillator arrangement is designed to operate. This store is subsequently referred to in connection with FIG. 1 as the calibration store.

If the relationship between the frequency of the variable frequency oscillator and the control signal which is fed to it contains only small non-linearities, i.e. the tuning sensitivity is almost constant, then very few separate frequency bands will be required to encompass the whole frequency range. However for great non-linearities many contiguous frequency bands will be required as the tuning sensitivity is assumed to be constant for all frequencies within a given frequency band. Thus the tuning sensitivity characteristic consists of straight line portions between break points which represent the boundary between contiguous frequency bands.

Preferably again all contiguous portions represent equal valued frequency bands.

Preferably said means for varying the rate at which pulses are generated also includes a variable frequency divider, the frequency divider operating to generate said succession of pulses from said fixed frequency source at an instantaneous rate which is dependent on the stored value representative of the tuning sensitivity which is applicable to the frequency band at which said variable frequency oscillator is oscillating.

Preferably a counter is arranged to count pulses derived from said variable frequency divider to detect when a break point is reached on the tuning sensitivity characteristic.

Preferably again means are provided for varying the magnitude of said control signal in dependence on the size of the frequency range over which the oscillator is to be swept.

Preferably yet again said means comprise a variable attenuator.

Preferably there is provided a pulse counter and a digital-to-analogue converter which generates said control signal having a magnitude dependent on the cumulative count of the counter.

BRIEF DESCRIPTION OF THE DRAWING

The invention is further described by way of example with reference to the accompanying drawing in which.

DESCRIPTION OF A PREFERRED EMBODIMENT

Figure 1:
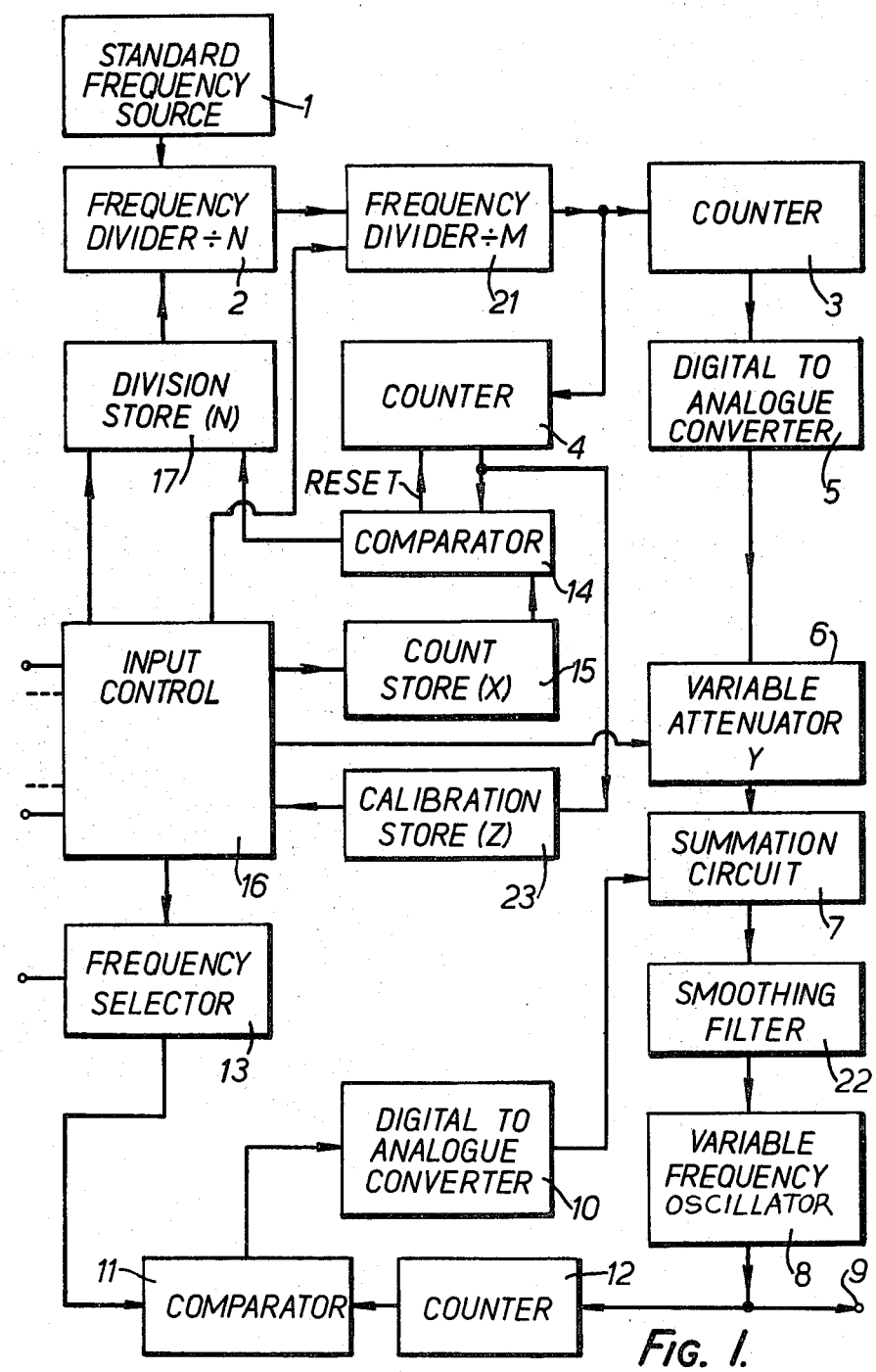
FIG. 1 shows in diagrammatic form a swept frequency oscillator arrangement in accordance with the present invention and FIG. 2 is an explanatory diagram.

Referring to FIG. 1, a standard frequency source 1, having a very stable frequency which is typically about 2 MHz, is fed via a first controllable variable frequency divider 2 and second variable frequency divider 21 to digital counters 3 and 4. The counter 3 is connected to a digital-to-analogue converter 5, which produces an analogue signal whose magnitude corresponds to the count of the counter 3, and the analogue signal is fed via a variable attenuator 6, a summing circuit 7 and a low pass filter 22 to the control input of a variable oscillator 8, which provides a swept frequency output signal at terminal 9.

The summing circuit 7 sums the signal from the variable attenuator 6 with that obtained from a further digital-to-analogue converter 10. In normal operation of the swept frequency oscillator arrangement in which the oscillator 8 provides an output which sweeps from a first selected frequency to a second selected frequency, the digital-to-analogue converter 10 produces a constant signal representative of the first selected frequency, and the other input to the summing circuit 7 represents the variable signal level.

The digital-to-analogue converter 10 is driven from a digital comparator 11 having two inputs, one input being obtained from the output of the variable oscillator 8 via a counter 12, and the other input being obtained from a frequency selector 13.

Additional circuitry is provided so that compensation can be provided for variations in the tuning sensitivity which stem from the non-linearity of the response of the variable oscillator 8, and this circuitry includes the counter 4 already referred to. The counter 4 is connected to a calibration store 23 and also feeds one input of a digital comparator 14, the other input of which is received from a count store 15, which is set by an input control circuit 16. This input control circuit 16 also sets a division store 17, which controls the division ratio N of the frequency divider 2. The input control circuit 16 also controls the degree of attenuation provided by the variable attenuator 6, in a manner which will be described subsequently.

Figure 2:
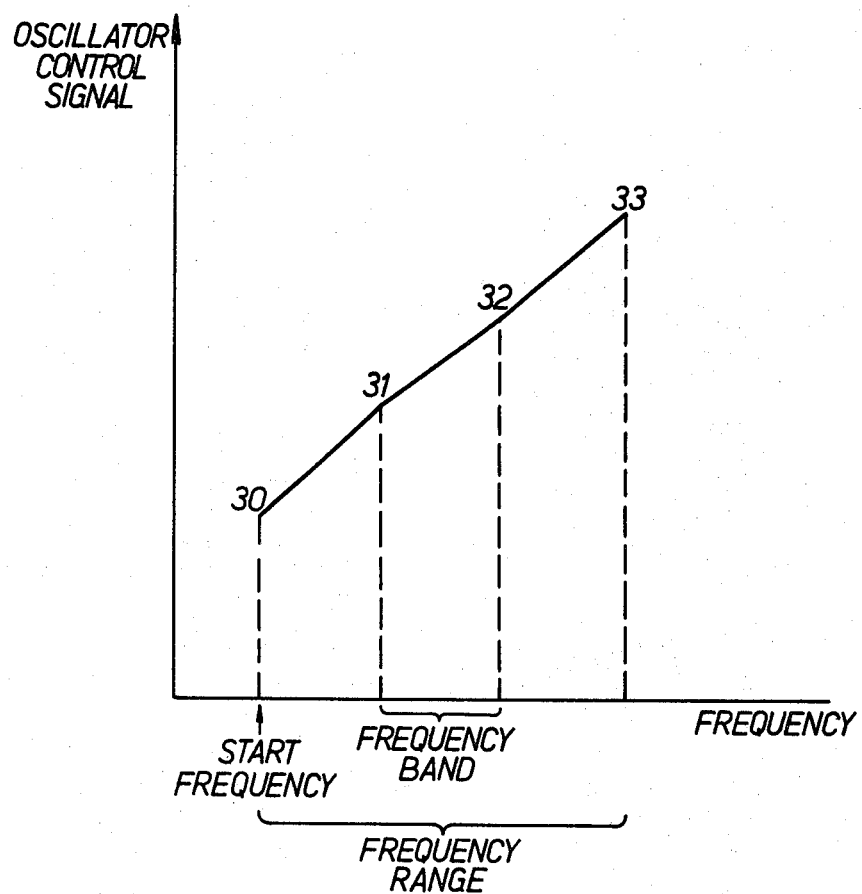

The extent of the non-linearity of the response of the variable oscillator may vary greatly over the frequency range of the oscillator, but provided a sufficiently small frequency interval is considered the response may be regarded as approximating a straight line segment of constant gradient. This is represented in FIG. 2 in which the variation of input control signal which must be applied to the oscillator so as to produce an output frequency which changes linearly with time is plotted against frequency. It will be seen that the curve consists of a number of straight line segments of differing gradient, and in this example it is assumed that the break points 30, 31, 32, 33 occur at 5 MHz intervals. Thus the tuning sensitivity is assumed to be a constant value from one break point to the next.

In order to determine the gradient between adjacent break points to enable the oscillator to be calibrated, the circuit shown in FIG. 1 operates as follows. A signal representative of a selected frequency corresponding to a break point is entered into the digital-to-analogue converter 10 via the frequency selector 13 and the digital comparator 11. Since the output of the oscillator is initially taken to be zero, the input to the comparator 11 is passed to the converter 10 without being modified by any feedback signal from counter 12. The frequency can be entered into the frequency selector 13 by any conventional means, say a keyboard switch. It is assumed that the output of the variable attenuator 6 is zero at this time so that the output at terminal 9 is due wholly to the signal level provided by converter 10. The actual output frequency is then measured on counter 12, and compared with the required frequency as indicated by the frequency selector. If a frequency difference is detected (and this would initially be normally the case) the output of the comparator 11 acts as a negative feedback signal to minimise the error, so that the variable oscillator 8 produces exactly the frequency entered into the frequency selector 13, and which corresponds to the first break point 30.

In order to determine the gradient of the segment between break points 30 and 31, the clock pulses from the standard frequency source 1 are passed via the frequency dividers 2 and 21 (in which the divisor value is set typically to unity but the actual values are not of importance, provided the values are kept constant during the calibration procedure) and are counted in both counters 3 and 4. The digital-to-analogue converter 5 generates from this count of clock pulses a rising staircase signal which is applied to the summing circuit 7 after it has been attenuated by the maximum predetermined attenuation factor of the variable attenuator 6. Thus the digital-to-analogue converter 5 provides an analogue signal which represents a cumulative sum of the clock pulses applied to the counter 3. At summing circuit 7 the attenuated signal is added to the constant signal from the converter 10 and passed via a smoothing filter 22 to control the variable oscillator 8. During this stage the converter 10 is disconnected from the comparator 11 to inhibit operation of the frequency control feedback loop of which it is a part.

In this way the output frequency obtained at terminal 9 steadily rises, until the frequency corresponding to break point 31 is detected. This is the start frequency plus 5 MHz in this example. The rising frequency can be measured by comparing the count in counter 12 with the new frequency of break point 31 applied to the frequency selector 13. When the new break point 31 is reached, the contents of counter 4 are transferred to the calibration store 23 under the control of the input control circuit 16, and the counters 3 and 4 are reset. The process is continued for subsequent frequency intervals until a table (termed the Z table) is built up in the calibration store 23 which consists of the number of clock pulses between pairs of adjacent break points. This information is indicative of the non-linearity of the frequency response of the variable oscillator 8, and represents the calibration of the swept frequency oscillator arrangement. If the circuit components are sufficiently stable it is envisaged that the calibration process will be performed only when the oscillator is manufactured, and that subsequent re-calibration should not be necessary.

The variable attenuator 6 is provided so as to maximise the resolution of the process. Consider the case where the total sweep of the oscillator is 100 MHz which is swept with no attenuation when the counter 3 is full or at its maximum count. Suppose the required sweep range is 50 MHz. This can be achieved by either half filling the counter 3 or dividing the analogue-signal by 2 using the variable attenuator 6. If the attenuator is used the counter 3 remains full and maximum resolution is achieved. Similar situations occur with sweeps less than 50 MHz, a special case occurring when the system is being calibrated. In the example under consideration, in which break points occur at 5 MHz intervals, the attenuation factor is chosen so that the counter 3 is about half full just before a break point is reached. Thus if the total frequency range of the oscillator 8 is 100 MHz, which is swept with the counter 3 full and no attenuation, and attenuation factor of 10 would sweep 10 MHz when the counter 3 is full and 5 MHz when it is half full.

During normal operation the oscillator 8 is controlled such that it can sweep between different selected pairs of frequencies, and at different selected sweep rates. This is achieved by setting up the oscillator arrangement as follows.

When it is desired to use the swept frequency oscillator arrangement to provide an output at terminal 9 which sweeps over a particular frequency range, the size of the frequency range is first selected. A typical example is a frequency range of 50 MHz which extends from a lower frequency of 75 MHz to an upper frequency of 125 MHz. Such a frequency range covers ten frequency bands, each of 5 MHz used to calibrate the system, and encompasses eleven break points (including the starting break point).

Once the size of the frequency has been selected this determines the attenuation factor Y of the variable attenuator 6 which is selected under control of the input control circuit 16. The counter 3 is progressively filled to the maximum extent consistent with the selected frequency range, since in order to minimise quantisation errors the counter 3 should be as full as possible when the maximum frequency of the frequency sweep is reached. The required attenuation factor Y is given by $Y = \Sigma Z / C$ where C is the capacity of counter 3 (which is the same as the capacity of counter 4) and $\Sigma Z$ is the sum of the individual Z values for all of the frequency bands forming part of the required frequency range. It should be noted that Y is not necessarily directly related to the number of frequency bands covered, since for each frequency band Z may be significantly less than the capacity of the counter 3. Thus if for two contiguous bands, ΣZ is less than C, no adjustment to the attenuation factor Y need be made. It is to be noted that in general the variable attenuation circuit 6 has preset standard attenuation values, typically 1, 2, 4, 8, 10, 20, and that in the expression $Y=\Sigma Z/C$, the value of Y is rounded up to the next greatest standard value.

The resulting attenuation factor is entered into the variable attenuator 6 as mentioned above.

Once the required attenuation value is chosen, the corresponding X value is calculated for each interval between a pair of adjustment break points. The X value is entered into the X store 15 by the input control circuit 16 and represents the count of the counter 4 which occurs between each pair of break points. In general $X = Y_s Z/Y_c$ where Ys is the current attenuation factor selected for the required sweep and Yc is the attenuation factor used to calibrate the system as described previously. The value of X is used to generate a corresponding value of N, the divisor value of the variable frequency divider 2. In general the value of N varies for each frequency band, and is given by the general expression $$N = (F_o F_f t_o)/(X F r)$$

where $F_o$ is the frequency of the standard frequency source 1, $F_f$ is the width of the frequency band used to calibrate the system, $t_o$ is the shortest time to sweep over the whole frequency range (in the example referred to previously the whole frequency range is 200 MHz), X is as defined above, and Fr is the required frequency range over which the oscillator 8 is currently arranged to sweep. It will be appreciated that the product $(F_o F_f t_o)$ is a constant, and thus that N is inversely proportional to X so that each frequency band of 5 MHz is swept at the same rate.

However, the actual sweep speed across the required frequency range is often related to other factors, and the further variable frequency divider 21 is provided, and its divisor value M is related directly to the required sweep speed, and is a constant for all frequency bands in a given frequency range. The selection of a divisor value M (which is selected as required by the input control circuit 16) does not affect the previously selected values of X and N, which are quite independent of the sweep speed.

The circuit thus operates as follows. The start frequency is entered directly into frequency selector 13 and the oscillator 8 is initially set to this frequency using the loop which includes counter 12, as previously explained. The standard frequency source 1 feeds clock pulses into the frequency dividers 2 and 21, where the clock rate is divided by the selected division values N and M, and the resulting pulses are counted in both counters 3 and 4. Those in counter 3 are used to progressively modify the control signal to the oscillator 8 so that it provides a swept frequency as required. The count in counter 4 is compared by comparator 14 with the selected current X value from count store 15, and when equality is reached the counter 4 is reset by the comparator 14, and the next pair of values of X and N used for the next frequency band between adjacent break points. Counter 3 is not reset, but continues to steadily increase its count but with a modified rate determined by the new value of N, this corresponding to the gradient of the next segment of the tuning sensitivity curve shown in FIG. 2. Thus for each segment a particular pair of values for X and N are used, and N is altered when the count of X is reached in counter 4.

This results in a very versatile arrangement, and it should be noted that a swept frequency range need not start or finish at a break point, but for intermediate points proportional values of X can be used. The input control circuit 16 can be used to perform the simple arithmetical functions needed to derive X and N, or these values could be calculated externally and applied via the input control circuit 16 to the stores 15 and 17 respectively as needed.

I claim:

1. A swept frequency oscillator arrangement including a variable frequency oscillator which provides a variable frequency output signal in dependence on the magnitude of a control signal; means for generating a succession of pulses derived from a fixed frequency source; means responsive to said pulses for producing said control signal; and means for varying the rate at which said pulses are generated so as to compensate for variations in the tuning sensitivity of said oscillator.

2. An arrangement as claimed in claim 1 and wherein the magnitude of said control signal at any instant is related to the number of said pulses which have been generated prior to that instant.

3. An arrangement as claimed in claim 1 and wherein there is provided a pulse counter which receives said succession of pulses, and a digital-to-analogue converter coupled to said counter and which generates said control signal having a magnitude dependent on the cumulative count of said counter.

4. An arrangement as claimed in claim 1 and wherein said control signal is smoothed by passing it through a low pass filter before it is applied to said variable frequency oscillator.

5. An arrangement as claimed in claim 1 and wherein said means for varying the rate at which pulses are generated includes a store which contains a plurality of values representative of the tuning sensitivity of said variable frequency oscillator for contiguous portions of the frequency range over which the swept frequency oscillator arrangement is designed to operate.

6. An arrangement as claimed in claim 5 and wherein all contiguous portions represent equal valued frequency bands.

7. An arrangement as claimed in claim 5 or 6 and wherein said means for varying the rate at which pulses are generated also includes a variable frequency divider, said frequency divider operating to generate said succession of pulses from said fixed frequency source at an instantaneous rate which is dependent on the stored value representative of the tuning sensitivity which is applicable to the frequency band at which said variable frequency oscillator is oscillating.

8. An arrangement as claimed in claim 7 and wherein a counter is arranged to count pulses derived from said variable frequency divider to detect when a break point is reached on the tuning sensitivity characteristic.

9. An arrangement as claimed in claim 1 and wherein means are provided for varying the magnitude of said control signal in dependence on the size of the frequency range over which said variable frequency oscillator is to be swept.

10. An arrangement as claimed in claim 9 and wherein said means comprise a variable attenuator.

11. A swept frequency oscillator arrangement, comprising:
a variable frequency oscillator having an output and an input, the frequency of the output of said oscillator being a predetermined function of a control signal applied to the input thereof;
storage means for storing values representative of the tuning sensitivity of said oscillator;
a fixed frequency source;
frequency divider means coupled to said storage means and said fixed frequency source, said frequency divider means generating pulses at an instantaneous rate determined by the values representative of said tuning sensitivity stored in said storage means; and
control signal generating mans coupled to the output of said frequency divider means and the input of said variable frequency oscillator, said control signal generating means providing a control signal to said oscillator having a magnitude dependent on the number of pulses generated at the output of said frequency divider means.

12. A swept frequency oscillator arrangement as claimed in claim 11 wherein said control signal generating means includes a counter coupled to the output of said frequency divider means and a digital-to-analog converter coupled to the output of said counter, the magnitude of said control signal being dependent on the cumulative count of said counter.

13. A swept frequency oscillator arrangement as claimed in claim 12 which further comprises a variable attenuator interposed between said digital-to-analog converter and the input of said oscillator, said variable attenuator varying the magnitude of said control signal in accordance with the frequency range over which said oscillator is swept.

* * * * *